United States Patent [19]

Ratzel et al.

[11] Patent Number: 4,896,112

[45] Date of Patent: Jan. 23, 1990

[54] METHOD FOR GENERATING SPIN ECHO PULSE SEQUENCES IN A NUCLEAR SPIN TOMOGRAPH, AND NUCLEAR SPIN TOMOGRAPH ADAPTED FOR CARRYING OUT SUCH METHOD

[75] Inventors: Dieter Ratzel, Rheinstetten; Norbert Schuff, Heidelberg, both of Fed. Rep. of Germany

[73] Assignee: Bruker Medizintechnik GmbH, Rheinstetten, Fed. Rep. of Germany

[21] Appl. No.: 241,440

[22] Filed: Sep. 7, 1988

[30] Foreign Application Priority Data

Sep. 9, 1987 [DE] Fed. Rep. of Germany ....... 3730148

[51] Int. Cl.$^4$ ........................................... G01R 33/20
[52] U.S. Cl. .................................................... 324/309
[58] Field of Search ............... 324/300, 307, 309, 318, 324/319, 320, 322

[56] References Cited

U.S. PATENT DOCUMENTS

| | | | |
|---|---|---|---|
| 4,585,995 | 4/1986 | Flagan | 324/322 |
| 4,628,262 | 12/1986 | Maudsley | 324/309 |
| 4,647,858 | 3/1987 | Bottomley | 324/322 |
| 4,665,365 | 5/1987 | Glover et al. | 324/309 |
| 4,698,591 | 10/1987 | Glover | 324/307 |

FOREIGN PATENT DOCUMENTS

| | | |
|---|---|---|
| 3434161 | 3/1986 | Fed. Rep. of Germany . |
| 3540086 | 5/1986 | Fed. Rep. of Germany . |

Primary Examiner—Michael J. Tokar
Attorney, Agent, or Firm—Pennie & Edmonds

[57] ABSTRACT

In nuclear spin tomography disturbances are encountered as a result of the insertion of the gradient fields, which disturbances are due to the generation of eddy currents and lead to field distortions making themselves felt, among other things, in the rapid decay of the echo signals of spin echo pulse sequences, i.e. in disturbances of the rephasing conditions. According to the invention, the rephasing conditions required for generating spin echo impulse sequences can be established either by varying the value of the static magnetic field between the excitation pulse and the next following rf pulse of a spin echo pulse sequence, or else by adjusting the interval between the excitation pulse and the next following rf pulse to a value different from half the interval between the subsequent rf pulses.

16 Claims, 3 Drawing Sheets

METHOD FOR GENERATING SPIN ECHO PULSE SEQUENCES IN A NUCLEAR SPIN TOMOGRAPH, AND NUCLEAR SPIN TOMOGRAPH ADAPTED FOR CARRYING OUT SUCH METHOD

The present invention relates to a method for generating spin echo pulse sequences in a nuclear spin tomograph, comprising a magnet for generating a homogeneous static magnetic field, at least one auxiliary coil to which a compensation current is applied, for correction of the static magnetic field, at least one gradient coil for generating a gradient field varying in space and directed in the same direction as the static magnetic field, which gradient coil can be subjected to currents varying over time, and at least one rf coil arrangement to which rf pulses can be supplied for exciting nuclear spins of a body located in the homogeneous static magnetic field and permitting the resonance signals generated by the excited nuclear spins to be received, the said method comprising the steps of exciting the nuclear spins by means of a sequence of rf pulses comprising a first excitation pulse and a subsequent sequence of rf pulses serving for exciting spin echoes, applying current pulses to the at least one gradient coil in the intervals between successive rf pulses, and compensating in addition the influence of the eddy currents and other inaccuracies produced by the generation of the gradient fields.

Given the fact that the required gradient fields have to be switched on and off frequently in nuclear spin tomography, a magnetic field varying with extreme rapidity is encountered at the beginning and also at the end of each gradient pulse which leads to deviations from the desired and calculated behavior of the system and of the results of the process carried out by means of such nuclear spin tomography. It has bee found that these deviations are due, mainly, to the fact that eddy currents are excited by the rapidly varying magnetic field, but also to other inaccuracies. In consequence thereof, one obtains a non-linear pattern of the gradient field, as described by EP No. 01 56 442 Al and EP No. 01 64 199 Al. The publications just mentioned propose to remedy these effects by certain measures for compensating the described non-linearity. One of these measures consists in the use of another coil arrangement producing a magnetic field which, though being directed in the same direction as the homogeneous magnetic field, generates a magnetic field which varies according to a non-linear pattern in space. The coil arrangements are to be supplied with a current adapted to ensure that the superposition of the magnetic fields of the coil arrangements results in the desired pattern of the density variation of the magnetic flux of the stationary field, in space and over time. To say it in other words: It is proposed to use an additional coil system to which currents are to be applied in such a manner that the beforementioned inaccuracies are compensated and the resulting field exhibits the desired evolution in space and over time. The other measure known from EP No. 01 64 199 Al, which consists in supplying the gradient coil with an excess current during the switching-on phase and in providing time-constant networks which are characteristic of the drop of the eddy-current field, acts in the same sense, i.e. here, too, the magnetic field resulting from eddy currents is compensated by an artificially generated additional magnetic field.

The measures described above are all intended to compensate the field distortion in space and over time caused by the induction of eddy currents and by other effects, by generating additional fields so that the sum of all fields results in the desired field pattern. These measures are necessarily very complicated, especially when, as usual, the nuclear spin tomograph uses three gradient fields extending perpendicularly relative to each other and deviating from the desired field pattern each in a different manner.

The field distortions occurring in the case of the known nuclear spin tomographs due to the insertion of the gradient fields lead among other things to the result that when the spin echo pulse sequences are applied the amplitude of the echo signals increases very rapidly so that only very few spin echo signals can be received and, accordingly, the application of spin echo pulse sequences is heavily impaired. The rapid decay of the amplitude of the echo signals permits the conclusion that the field distortions prevent the rephasing conditions necessary for generating echo signals from being built up. It is true that compensation of the field distortions in space and over time may also lead to conditions where the rephasing requirements are fulfilled and a large number of echo signals is obtained; however, as has been mentioned before, the measures previously known for compensating the field distortion are very complicated and achieve only insufficient compensation of the field distortions so that when applying spin echo pulse sequences one does not, in spite of such measures, obtain a number of echo signals sufficiently large to benefit of the advantages of such spin echo pulse sequences.

Now, it is the object of the present invention to compensate the field distortions resulting from the generation of eddy currents and other inaccuracies in a simple manner and so that the application of spin echo pulse sequences leads to a great number of echo pulses so that full use can be made of the advantages connected with the application of such spin echo pulse sequences.

This object is achieved according to the invention by the fact that a current pulse is applied to the auxiliary coil, at least in the time interval between the excitation pulse and the next following rf pulse, or only between the rf pulses serving for generating spin echoes, which current pulse effects a variation of the static magnetic field limited in time so as to balance out, at least approximately, the dephasing effect on the excited nuclear spins resulting from the variation to which the static magnetic field is subjected by the insertion of the at least one gradient field.

The invention is based on the recognition that it is not necessary—and probably not even possible in practice—to effect such complicated field corrections, but that it will suffice to compensate any disturbances of the homogeneous magnetic field. And even then, it is not necessary to keep the magnetic field at any time at the desired value, the phase position of the excited nuclear spins being determined only by the time integral over the field strength to which the spins are exposed, counting from the time of excitation.

Consequently, the details of the time pattern of the magnetic field are not of decisive importance for the rephasing effect; the only thing that matters is that the time integral of the magnetic field strength must comply with certain requirements. In particular, the time integral of the magnetic field strength over the time interval between the excitation pulse and the subsequent rf pulse must be half the time integral of the magnetic field strength over the interval between the rf pulses serving for generating the spin echoes. Considering, however, that this time integral is always the same, regardless of the different distortions encountered, but will differ from the double value of the time integral of the magnetic field strength over the interval between the excitation pulse and the subsequent rf pulse, it is only necessary to vary the magnetic field strength during this first interval, or else during all other intervals, in such a manner that the before-mentioned condition regarding the integrals of the magnetic field strength over the stated time intervals is observed. According to the before-mentioned first embodiment of the invention, this is achieved by the fact that the static magnetic field is increased or reduced with the aid of the auxiliary coil, which usually provided for adjusting and stabilizing the magnetic field at a pre-determined value, until the rephasing conditions are fulfilled. A particular advantage of the method according to the invention lies in the fact that the value of the current pulse that has to be applied to the auxiliary coil can easily be determined experimentally by observing the echo signals.

The above considerations, from which it results that the time integral of the magnetic field strength over the intervals between the rf pulses are of decisive importance for the observation of the rephasing conditions, indicate that according to a second embodiment of the invention, instead of supplying a current pulse to the auxiliary coil, it is also possible to adjust the spacing between the excitation pulse and the subsequent rf pulse to such a value, different from half the spacing between the following rf pulses, that the dephasing effect on the excited nuclear spins, which result from the variation caused to the static magnetic field by the insertion of at least one gradient field, is again compensated, at least approximately.

It can be seen here, too, that the appearance of spin echo pulses can be used as criterion for the adjustment of the optimum interval between the first excitation pulse and the next following rf pulse.

It is a particular advantage of the method according to the invention that no complicated coil arrangements are required, for example for producing non-linear fields, and that what matters is only the total effect of the current pulse, not the details of its shape and duration. This is also the reason why the effect of all gradient fields is taken into consideration, without the need to regard the specific properties of the individual gradient fields individually. In addition, there generally exists a linear relationship between the current used for generating a gradient field and the current and/or the duration of the current flow through the auxiliary coil and/or the time interval between the excitation pulse and the next following rf pulse relative to half the interval between the following rf pulses of the pulse sequence. It is therefore provided, according to a preferred embodiment of the invention, that the value of the current pulse and/or the variation of the interval between the excitation pulse and the next following rf pulse, relative to half the interval between the following rf pulses, is proportional to the value of at least one gradient field.

This feature is of particular interest for methods using a phase gradient whose value is varied in steps at least once for each excitation. The value of the current pulse and/or the variation of the interval between the excitation pulse and the next following rf pulse, relative to half the interval between the following rf pulses, may then be proportional to the value of the phase gradient. It should be noted once more in this connection that the term "value of the current pulse" is meant to describe the integral of the current over the duration of the pulse.

From the above consideration it follows further that the method according to the invention can be used with advantage only when the value of a gradient, in particular of the phase gradient, is varied not only for each excitation, but when the gradient is varied after each excitation during one or more of the intervals of the sequence of rf pulses, as for example in the case of high-speed imaging processes. In this case, it will of course no longer be sufficient to apply one current pulse to the auxiliary coil between the excitation pulse and the next following rf pulse; rather, it will be necessary in this case to apply a current pulse to the auxiliary coil for each variation of the phase gradient, in the course of a pulse sequence, while the pulse between the excitation pulse and the next following rf pulse may then be dropped. If—as will be the rule if the rephasing conditions are to be met—the phase gradient is switched on with inverse sign in each interval between two rf pulses, before and after the appearance of the echo signal, then it will be convenient to apply a current pulse with a sign inverse to the sign of the inserted phase gradient also to the auxiliary coil, every time the phase gradient is switched on.

Nuclear spin tomographs are usually used for generating cross-sectional images of a larger body. It is necessary for this purpose to select from the body the disk which is to supply the cross-sectional image. This is achieved by the use of a disk-selection gradient which is switched on during application of the excitation pulse. However, the disk-selection gradient may also lead to undesirable dephasing phenomena, which are compensated by a portion with inverse sign which is applied during the time interval between the excitation pulse and the next following rf pulse. If the invention is used in connection with a method making use of such a disk-selection gradient followed by a portion with inverse sign, then the current pulse applied to the auxiliary coil may in a particularly advantageous manner be generated simultaneously with the occurrence of the inverse-sign portion of the disk-selection gradient.

In addition, it may be convenient if the gradients which are to be inserted in the course of the rf pulse sequence are switched on at least once when starting the method according to the invention, at least before the first rf pulse sequence is irradiated; one achieves in this manner sort of a stationary condition at which the disturbances caused by eddy currents and other inaccuracies have a predetermined fixed value which can be balanced out very easily and with very high stability by the method according to the invention.

The present invention further relates to a nuclear spin tomograph comprising a magnet for generating a homogeneous static magnetic field, at least one auxiliary coil that can be supplied with a compensation current, for correction of the static magnetic field, first means for generating the current to be supplied to the auxiliary coil, at least one gradient coil for generating a gradient field varying in space and directed equally to the static magnetic field, second means for supplying the at least one gradient coil with currents varying over time, at least one rf coil arrangement, third means for generating rf pulses which can be supplied to the rf coil arrangement for exciting the nuclear spins of a body located in the homogenous static magnetic field and which include a first excitation pulse and a sequence of rf pulses following the said excitation pulse, and fourth means for receiving the resonance signals generated by the excited nuclear spins.

A nuclear spin tomograph of this type may be designed for carrying out the method of the invention in such a manner that the second means is adapted for generating a signal characteristic of the value and/or duration of the current supplied to the at least one gradient coil and that the said signal is supplied to the first means for controlling the current supplied to the auxiliary coil and/or to the third means for controlling the interval between the first and the second rf pulse.

Such a design of a nuclear spin tomograph distinguishes itself by a very simple structure because the signal serving to excite a variable gradient is used also directly for controlling the value of the current to be supplied to the auxiliary coil and/or the adjustment of the interval between the first and the second rf pulse. The use of corresponding means then permits not only to observe a strict proportionality, but also to adhere to any functional relationships that may have been determined experimentally in the manner described before.

According to a preferred embodiment of such a nuclear spin tomograph, the first means comprises a gate circuit and a first power amplifier feeding the auxiliary coil, while the second means is adapted for generating current pulses and comprises a second power amplifier feeding the gradient coil to which the current pulses are supplied for generating the gradient field. The current pulses are further supplied to the gate circuit of the first means which transmits selected current pulses to the first power amplifier whose amplification factor is adjusted to the desired relationship between the currents flowing through the gradient coil and the auxiliary coil.

Analogously, when the time interval between the excitation pulse and the next following rf pulse is to be varied, the third means may comprise a timing element controlling this time interval, and the second means may be adapted for generating current pulses and comprise a power amplifier feeding the gradient coil to which the current pulses for generating the gradient field are supplied. In addition, the current pulses are supplied to the timing element of the third means which effects that the value of the beforementioned time interval is varied in proportion to the value of the respective current pulse.

The invention will now be described in more detail with reference to the embodiments shown in the drawings. The features that can be derived from the following description and the drawings may be used in other embodiments of the invention either individually or in any desired combination. In the drawing FIG. 1 shows a diagrammatic representation of a nuclear spin tomograph designed according to the invention; and FIG. 2 shows the pulse diagram of one embodiment of the method according to the invention which can be carried out using the nuclear spin tomograph according to FIG. 1.

Figure 1:
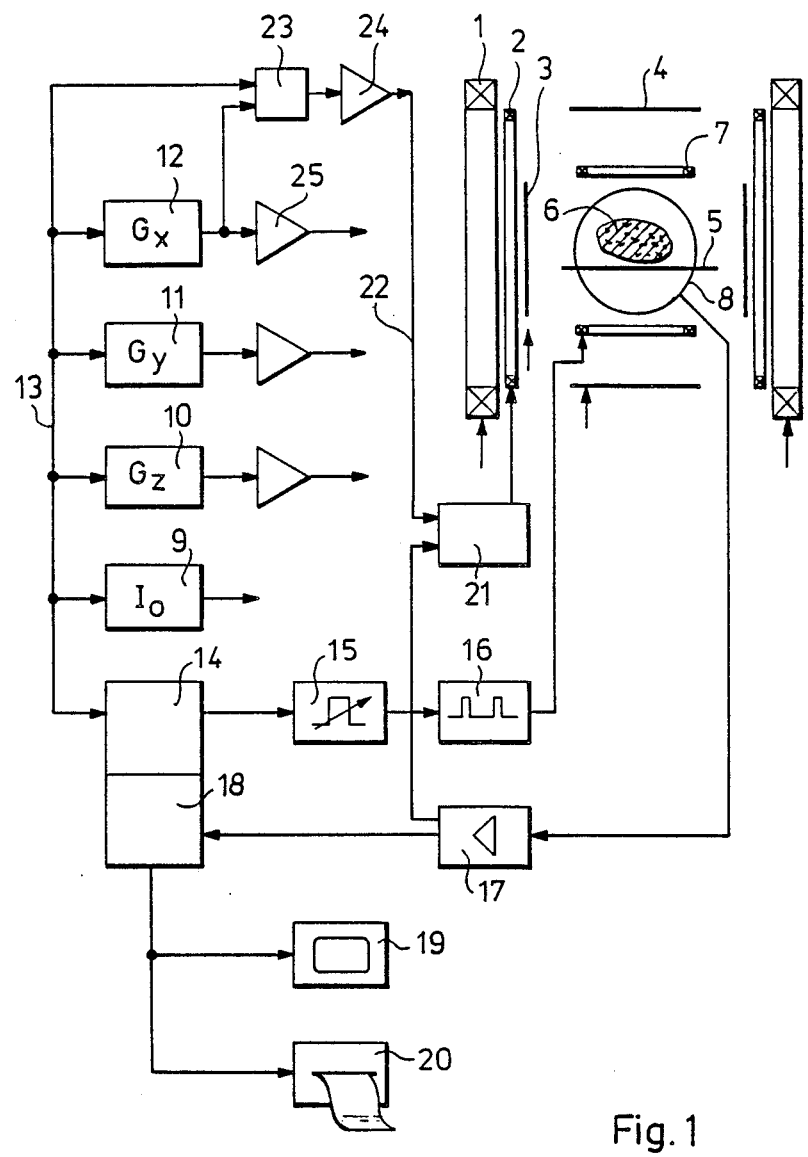

The nuclear spin tomograph illustrated in FIG. 1 comprises a first magnet coil system 1 for generating a homogeneous magnetic field. The magnet coil system 1 may be a superconductive or resistive solenoid or double Helmholtz system. The described first magnet coil system coacts with an auxiliary coil 2, for example in the form of a simple Helmholtz system which also generates a homogenous magnetic field which may be directed either in the same sense or in a sense opposite to the magnetic field generated by the first magnet coil system 1 and by which the value of the main field generated by the magnet coil system 1 can be varied, in particular for the purpose of stabilizing the magnetic field.

The nuclear spin tomograph illustrated in the drawing further comprises three gradient coils of which two gradient coils 3 and 4 can be seen in FIG. 1. The one gradient coil 3 effects a variation of the static magnetic field in the z direction, while the other gradient coil 4 effects a variation in the x direction. Another gradient coil, which is not illustrated because of the diagrammatic representation, effects a variation of the homogenous magnetic field in the y direction. A sample holder 5 enables a sample 6 to be located in the center of the coil arrangement where a homogeneous magnetic field prevails, to which gradient fields as linear as possible are heterodyned. Above and below the sample 5, one can see transmitter coils 7 with their axes extending perpendicularly to the axis of the first magnet coil system 1, while receiver coils 8 are again arranged perpendicularly to these two axes.

A power supply unit 9 feeds the first magnet coil system 1, while other power supply units 10, 11, 12 serve for feeding the gradient coil 3, 4, etc. For the sake of clarity, the connections required for this purpose are not shown in detail in FIG. 1.

The power supply units 9 to 12 are supplied with control signals from a control unit 14, via a control line 13, which control signals determine the value of the current flowing through the individual coils and also the duration of the current flow. The control unit 14 further actuates, via a setting member 15, an rf pulse generator 16 to which the transmitter coil 7 is connected. Analogously, the receiver coils 8 are connected to an rf receiver 17 whose output signal is supplied to an evaluation circuit 18. The output of this evaluation circuit 18 is in turn connected to a display 19 and a plotter 20.

In the case of the illustrated embodiment of the invention, the auxiliary coil 2 is part of a so-called "field lock" where the frequency of a selected nuclear species located in the homogenous magnetic field is monitored by means of the rf receiver 17 and the auxiliary coil 2 is supplied, via a summing circuit, by a current ensuring that the frequency of the selected nuclear species is maintained at a predetermined value. At the same time, the auxiliary coil 2 is fed with a current which is supplied to the summing circuit 21 via a line 22 and is proportional to the current which the power supply unit 12 supplies to the gradient coil for the x direction. The output signal of the power supply unit 12 is supplied—via a gate circuit 23 whose opening intervals are determined by the control unit 14—to a power amplifier 24 generating the current for the auxiliary coil 2, the relationship between the instantaneous magnetic field produced by the auxiliary coil 2 and the strength of the x gradient field being determined by the amplification factor of the power amplifier 24, relative to the amplification factor of the power amplifier 25 connected to the output of the power supply unit 12 for the x gradient coils.

Figure 2:
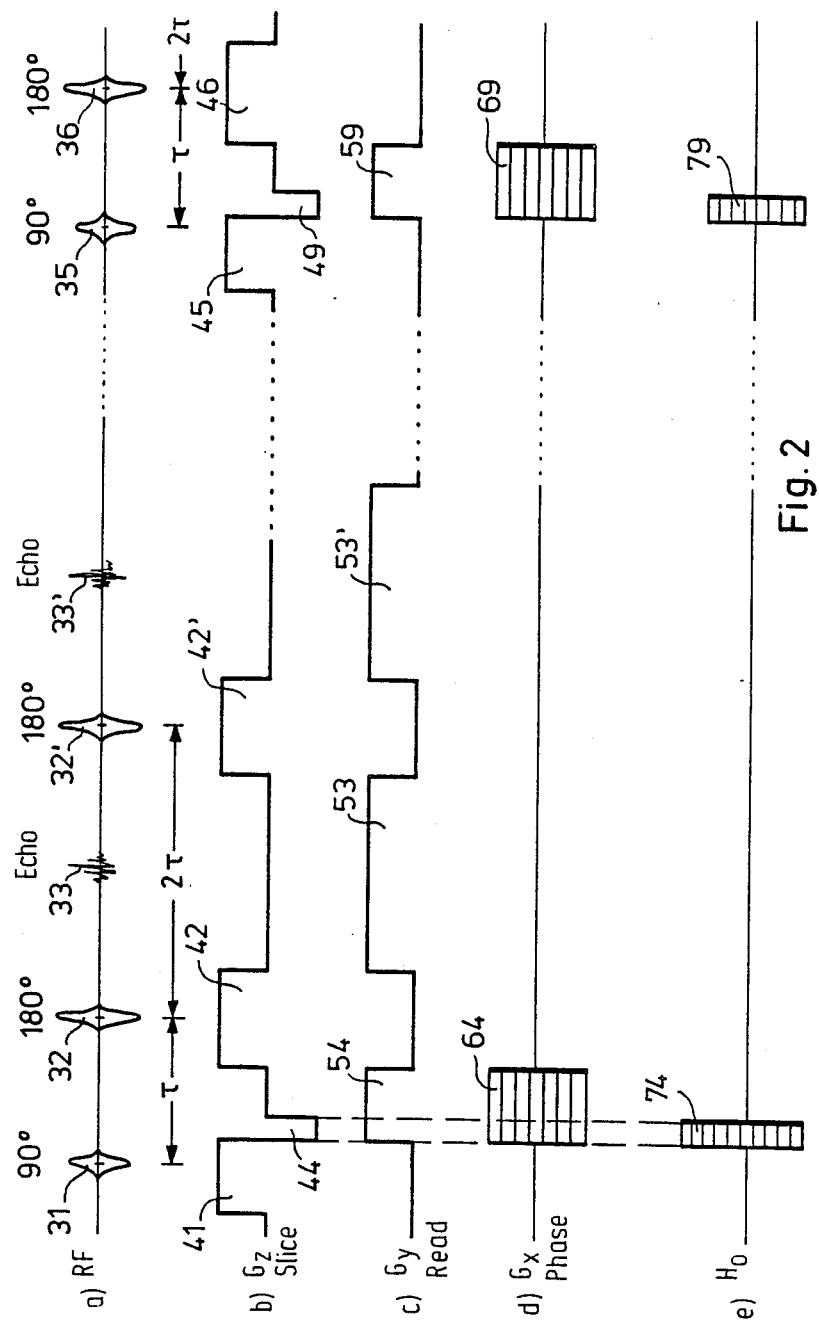

The method illustrated in FIG. 2 can be carried out without any difficulty with the aid of the embodiment of a nuclear spin tomograph illustrated diagrammatically in FIG. 1.

The rf pulse generator 16 generates, under the influence of control signals arriving from the control unit 14, the sequence of rf pulses illustrated in line (a) of FIG. 2 comprising an excitation pulse in the form of a first 90° pulse 31 followed by a sequence of rf pulses serving for generating spin echoes which, in the embodiment shown, consist of 180° pulses 32, 32', etc. The interval between the 180° pulses 32, 32' is equal to twice the interval $\tau$ between the first 90° pulse 31 and the next following 180° pulse 32. The known rephasing conditions are adhered to, and an echo pulse 33, 33', etc. appears in the middle between each pair of successive 180° pulses.

For the purpose of generating image representations—of the type desired, for example, in nuclear spin tomography—one excites for example only the nuclear spins encountered in a disk extending perpendicularly to the z axis, i.e. to the direction of the homogeneous magnetic field. This selective excitation is achieved by inserting a z gradient $G_z$ during application of the 90° pulse 31. The duration and strength of the gradient field are illustrated by the pulse-like section 41. In addition, the disk or selection gradient $G_z$ is switched on during each occurrence of the 180° pulses, as indicated by the pulse-like sections 42, 42'. The selection gradient 41 acting only upon the spins excited by the 90° pulse 31 and having insofar a dephasing effect, the portion of the z gradient inserted during the 90° pulse 31 is followed by a portion 44 with inverse sign.

The resolution of the spins excited in the disk in the y direction is achieved by a read gradient which is switched on in symmetry to the occurrence of each echo signal 33, 33', as illustrated by the pulse-like sections 53, 53' in line (c) of FIG. 2. The necessity to observe the rephasing conditions requires that the read gradient be inserted also in the interval between the 90° pulse 31 and the next following pulse 32, as illustrated by section 54 in line (c) of FIG. 2.

Finally, the resolution of the image in the x direction is also necessary for the generation of images. This is achieved by inserting an x gradient $G_x$, which is also described as phase-encoding gradient, in the area between the 90° pulse and the next following 180° pulse. The parallel lines in the box 64 in line (d), illustrating the insertion of the x gradient, indicates that the value of the x gradient is varied following each excitation.

FIG. 2 shows another excitation following the first excitation by the 90° pulse 31 and comprising likewise a first 90° pulse 35 followed by a 180° pulse 36, of which only the first one is shown in the drawing. This pulse sequence is again accompanied by the corresponding gradients, starting with the z gradient in line (b) with its sections 45, 46, 49, followed by the read gradient with its section 59 and the other sections not shown in the drawing, and finally also by the phase-encoding gradient 69 in line (d) which, as has been mentioned before, has a value different from the value of the phase-encoding gradient 64 of the preceding excitation. The method just described is insofar a usual spin echo method which is well known to the man skilled in the art, in every respect.

Now, according to the invention, the auxiliary coil 2 is supplied with a current 74 or 79 of a value proportional to the value of the phase gradient 64 or 69, respectively, (see FIG. 2, line (e)), during the same time interval during which the portion 44 or 49, respectively, of the z gradient is generated. As has been mentioned before, for producing this current, the same signal which is supplied to the power amplifier 25 for producing the current which is supplied to the x gradient coil, is also supplied to the power amplifier 24, via the gate circuit 23, the output of the said power amplifier 24 being connected to the summing circuit 21 of the auxiliary coil 2 and feeding the auxiliary coil with a current whose duration depends on the opening time of the gate circuit 23 and whose value depends on the value of the control signal received and the amplification factor of the power amplifier 24. As has been described before, the control unit 14 causes the gate circuit 23 to open for the duration of the negative section 44 of the disk-selection gradient illustrated in line (b) in FIG. 2. The echo signals 33, 33' are observed, and the amplification factor of the power amplifier 24 is adjusted in such a manner that the maximum number of echo signals is obtained, while the current supplied to the auxiliary coil 2 is always adjusted to be proportional to the value of the phase-encoding gradient. One succeeds in this manner in maintaining the rephasing conditions, which have been adjusted by generating the additional magnetic field by means of the auxiliary coil 2, for all possible values of the phase-encoding gradient.

As has been explained above, instead of varying the static magnetic field, the rephasing conditions can be created also by varying the interval between the excitation pulse and the next following rf pulse serving for generating the spin echo, while leaving the intervals between the remaining rf pulses unchanged. In the case of the nuclear spin tomograph illustrated in FIG. 1, this can be achieved by influencing the setting member 15 in response to the value of the phase-encoding gradient $G_x$ in a manner to vary the interval between the first 90° pulse and the next following 180° pulse.

It is further understood that the value of the current flowing through the auxiliary coil and/or the interval between the excitation pulse and the rf pulse is not determined by the phase-encoding gradient alone, but rather by the value of all gradients. Accordingly, the current as well as the interval may both be given a specified basic value, and only their variation may be proportional to the varying gradient.

Finally, there have been known pulse sequences where the phase-encoding gradient is varied not only after each excitation pulse, but also between every two successive rf pulses, which permits a complete image to be recorded in a high-speed imaging process, with only a single excitation. Although it is of course no longer possible in this case to rely on the variation of the time-interval between the excitation pulse and the rf pulse it is then possible to supply to the auxiliary coil, in each interval between two successive rf pulses, a current varying in response to the value of the phase-encoding gradient. It would, however, also be imaginable to vary instead the length of the interval between the successive rf pulses.

For the sake of completeness it should be noted here that the invention lends itself for application in connection with all imaginable spin echo pulse sequences, including for example sequences of 90 pulses for generating stimulated echoes of the type described, for example, by Frahm et al. in the Journal of Magnetic Resonance, Vol. 64, 1985, pages 81 to 93.

The following example illustrates the improvement which may be achieved with the invention. It comprises the investigation of a cylindrical water phantom having a diameter of about 20 cm which was placed within the room temperature bore of a superconducting magnet of a whole-body NMR-tomograph. The room temperature bore had a diameter of about 1 m, and the water phantom was exposed therein to a static magnetic field of about 2.35 tesla. The phantom was excited by a series of RF-pulses in the presence of gradient fields essentially as shown in FIG. 2. The gradient field along an axis of the superconducting magnet was produced by an anti-Helmholtz coil configuration producing a gradient strength $G_z$ of about 4 mT/m. The transverse gradient field $G_y$ was produced by a pair of saddle coils producing a gradient strength $G_y$ of about 4 mT/m. There was no transverse gradient $G_x$ produced.

In the series of RF-pulses, the first 180°-pulse was separated from the first 90°-pulse by about 15 ms so that the time interval between the 180°-pulses was about 30 ms. Correspondingly, the portion 42 of the $G_z$-slice pulse had a duration of about 8 ms, whereas the portions 42 had a duration of about 12 ms and were separated by about 18 ms. Correspondingly, the portions 54 and 53 of the $G_y$-read pulse had a duration of about 8 ms and about 18 ms, respectively.

Figure 3:
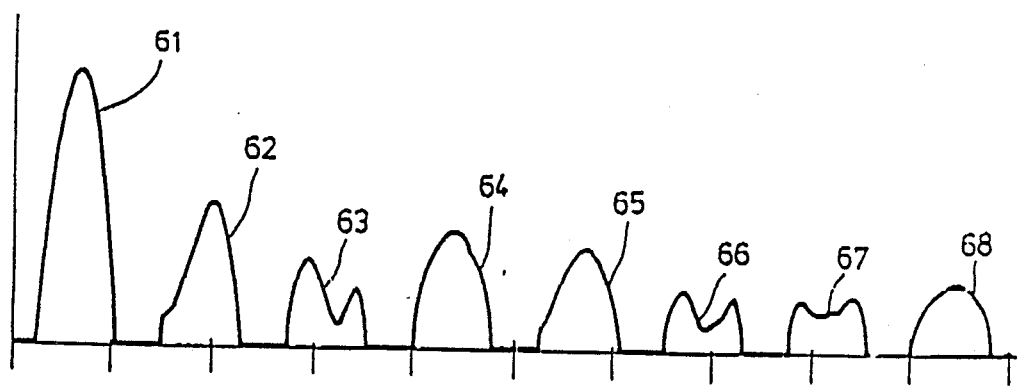
FIG. 3 shows a diagram of the Fourier-transforms of eight spin echos obtained from excitation of a cylindrical water phantom by a series of rf-pulses in the presence of gradient fields.
Figure 4:
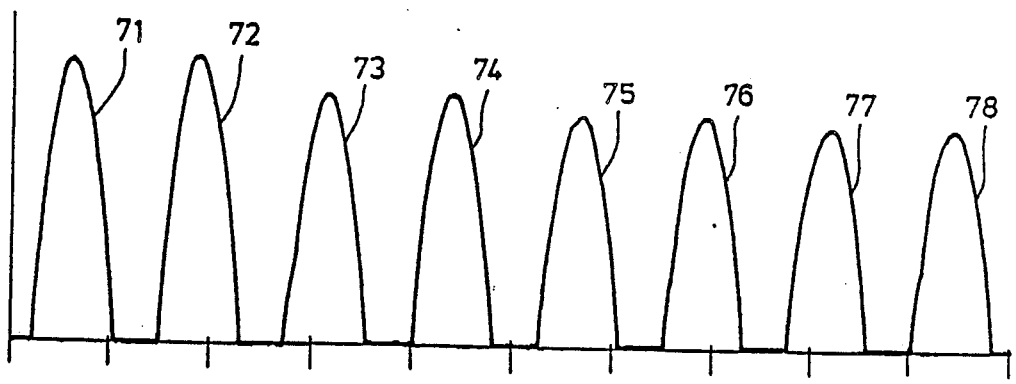
FIG. 4 shows again the Fourier-transforms of eight spin echos obtained under the same conditions as the spin echos shown in FIG. 3 after applying a compensation current in accordance with the invention.

FIG. 3 shows a diagram of the Fourier-transforms of eight spin echos obtained under the above mentioned conditions from said water phantom. The individual spin echoes correspond to identical slices across the phantom 61-68 obtained after eight 180°-pulses without applying a compensation current through the auxiliary compensation coil. The distortions present in the pulses 62 to 68 following the first pulse 61 are obvious. Thereafter, a current pulse $H_o$ according to line (e) in FIG. 2 was fed to the auxiliary coil, the strength and duration of the current having been selected to compensate the dephasing induced by the switching of gradient fields $G_z$ and $G_y$. The strength and duration of the current was determined to produce a homogeneous magnetic field of about 5.5 µT for a duration of about 5 ms. The result is illustrated by FIG. 4 which shows again the Fourier-transforms of eight spin echoes 71-78 obtained under the same conditions as the spin echos shown in FIG. 3. It is evident, that the spin echos 71 to 78 are substantially no longer distorted by dephasing current effects but show a T2-decrease only.

Similar results were obtained by a pulse delay according to claim 2 which was in the order of 10 ns. This pulse delay was realized by a corresponding change of the pulse phase.

We claim:

1. A method for generating spin echo pulse sequences in a nuclear spin tomograph, comprising a magnet for generating a homogeneous static magnetic field, at least one auxiliary coil to which a compensation current is applied for correction of the static magnetic field, at least one gradient coil for generating a gradient field varying in space and directed in the same direction as the static magnetic field, which gradient coil can be subjected to currents varying over time, and at least one rf coil arrangement to which rf pulses can be supplied for exciting nuclear spins of a body located in the homogeneous static magnetic field and permitting resonance signals generated by the excited nuclear spins to be received, said method comprising the steps of exciting the nuclear spins by means of a sequence of rf pulses comprising a first excitation pulse and a subsequent sequence of rf pulses serving for exciting spin echoes, a first rf pulse of the subsequent pulse sequence being spaced from the excitation pulse by a first time interval and the rf pulses of the subsequent pulse sequence being spaced from each other by second time intervals, and applying further current pulses to the at least one gradient coil in the intervals between successive rf pulses, and compensating in addition the influence of eddy currents and other field effects produced by generation of the gradient fields, characterized in that a current pulse is applied to the auxiliary coil, at least in one of the time intervals comprising the first and the second time intervals, between the excitation pulse and the next following rf pulse which current pulse effects a variation of the static magnetic field limited in time so as to compensate a dephasing effect on the excited nuclear spins resulting from a variation to which the static magnetic field is subjected by the insertion of one or more gradient fields.

2. Method according to claim 1, characterized in that the value of the current pulse is proportional to the value of the at least one gradient field.

3. Method according to claim 2 using a phase gradient which is varied in value in steps at least once for each excitation, characterized in that the value of the current pulse is proportional to the value of the phase gradient.

4. Method according to claim 1 using a disk-selection gradient comprising in the first time interval a portion of inverse sign, characterized in that the current supplied to the auxiliary coil is generated simultaneously with the appearance of the portion of the inverse-sign portion of the disk-selection gradient.

5. Method according to claim 1 using a phase gradient which is varied after each excitation during one or more of the second time intervals, characterized in that each variation of the phase gradient is accompanied by a current pulse supplied to the auxiliary coil.

6. Method according to claim 5, where an inverse-sign phase gradient is inserted during every second time interval before and after an appearance of an echo signal, characterized in that every time the phase gradient is inserted, a current pulse with a sign corresponding to the sign of the inserted phase gradient is supplied to the auxiliary coil, too.

7. Method according to claim 1, characterized in that gradients which are to be inserted in the course of the rf pulse sequence are switched on at least once before irradiation of at least the first rf pulse sequence.

8. A method for generating spin echo pulse sequence in a nuclear spin tomograph, comprising a magnet for generating a homogeneous static magnetic filed, at least one auxiliary coil to which a compensation current is applied for correction of the static magnetic field, at least one gradient coil for generating a gradient field varying in space and directed in the same direction as the static magnetic field, which gradient coil can be subjected to currents varying over time, and at least one rf coil arrangement to which rf pulses can be supplied for exciting nuclear spins of a body located in the homogeneous static magnetic field and permitting resonance signals generated by the excited nuclear spins to be received, said method comprising the steps of exciting the nuclear spins by means of a sequence of rf pulses comprising a first excitation pulse and a subsequent sequence of rf pulses serving for exciting spin echoes, a first rf pulse of the subsequent pulse sequence being spaced from the excitation pulse by a first time interval and the rf pulses of the subsequent pulse sequence being spaced from each other by second time intervals, and applying further current pulses to the at least one gradient coil in the intervals between successive rf pulses, and compensating in addition the influence of eddy currents and other field effects produced by generation of the gradient fields, characterized in that the first time interval is adjusted to a value different from half the second time interval which ensures that a dephasing effect on the excited nuclear spins resulting from a variation to which the static magnetic field is subjected by the insertion of the at least one gradient field is compensated at least approximately.

9. Method according to claim 8, characterized in that a variation of the first time interval, relative to half the second time interval, is proportional to a value of the at least one gradient field.

10. Method according to claim 9 using a phase gradient whose value is varied in steps at least once for each excitation of said nuclear spins, characterized in that the variation of the first time interval, relative to half the second time interval, is proportional to the value of the at least one gradient field.

11. Method according to claim 8, using a phase gradient which is varied after each excitation of said nuclear spins during one or more of the second time intervals, characterized in that each variation of the phase gradient is accompanied by a current pulse supplied to the auxiliary coil.

12. Method according to claim 11, where an inverse-sign phase gradient is inserted during every second time interval before and after the appearance of the echo signal, characterized in that every time the phase gradient is inserted, a current pulse with a sign corresponding to a sign of the inserted phase gradient is supplied to the auxiliary coil, too.

13. Method according to claim 8, characterized in that gradients which are to be inserted in the course of the rf pulse sequence are switched on at least once before irradiation of at least the first pulse sequence.

14. Nuclear spin tomograph comprising a magnet for generating a homogeneous static magnetic field, at least one auxiliary coil that can be supplied with a compensation current, for correction of the static magnetic field, first means for generating the current to be supplied to the auxiliary coil, at least one gradient coil for generating a gradient field varying in space and directed equally to the static magnetic field, second means for supplying the at least one gradient coil with currents varying over time, at least one rf coil arrangement, third means for generating rf pulses which can be supplied to the rf coil arrangement for generating nuclear spins of a body located in the homogeneous static magnetic field and which include a first excitation pulse and a sequence of rf pulses which follow said first excitation pulse after a first time interval, which serve for generating spin echoes and are separated from each other by one second time interval each, and fourth means for receiving resonance signals generated by the excited nuclear spins, characterized in that the second means is adapted for generating a signal characteristic of at least one of the values, i.e. the strength and duration, of the current supplied to the at least one gradient coil and that the said signal is supplied to at least one of the means comprising the first means for controlling the current supplied to the auxiliary coil and the third means for controlling the first time interval.

15. Nuclear spin tomograph according to claim 14, characterized in that the first means comprises a gate circuit and a first power amplifier feeding the auxiliary coil, while the second means is adapted for generating current pulses and comprises a second power amplifier feeding the gradient coil to which the current pulses are supplied for generating the gradient field and that the current pulses are further supplied to the gate circuit of the first means which transmits selected current pulses to the first power amplifier whose amplification factor is adjusted to a desired relationship between the currents flowing through the gradient coil and the auxiliary coil.

16. Nuclear spin tomograph according to claim 14, characterized in that said third means comprises a timing element for controlling the duration of said first time interval, that said second means is arranged to generate current pulses and comprises a power amplifier feeding said gradient coil to which the current pulses for generating the gradient field are supplied, and that in addition the current pulses are supplied to the timing element of said third means, which timing element effects a variation of the duration of said first time interval in proportion to the value of the respective current pulses.

* * * * *